US006410459B2

(12) United States Patent
Blalock et al.

(10) Patent No.: US 6,410,459 B2
(45) Date of Patent: Jun. 25, 2002

(54) WAFER PLANARIZATION USING A UNIFORM LAYER OF MATERIAL AND METHOD AND APPARATUS FOR FORMING UNIFORM LAYER OF MATERIAL USED IN SEMICONDUCTOR PROCESSING

(75) Inventors: Guy T. Blalock; Hugh E. Stroupe; Brian F. Gordon, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/930,022

(22) Filed: Aug. 14, 2001

Related U.S. Application Data

(62) Division of application No. 09/389,644, filed on Sep. 2, 1999.

(51) Int. Cl.[7] .................... H01L 21/31; H01L 21/469
(52) U.S. Cl. .................... 438/782; 438/692; 438/758; 438/760; 438/780
(58) Field of Search .................. 438/692, 758, 438/760, 633, 781, 780, 782; 425/412

(56) References Cited

U.S. PATENT DOCUMENTS 5,967,030 A * 10/1999 Blalock .................... 100/211

* cited by examiner

*Primary Examiner*—Alexander G. Ghyka
(74) *Attorney, Agent, or Firm*—Klarquist Sparkman, LLP

(57) ABSTRACT

In connection with wafer planarization, an apparatus for forming a layer of material having a substantially uniform thickness and substantially parallel first and second major surfaces includes a pair of pressing elements and a stop. Each of the pair of pressing elements has a flat pressing surface. The pressing surfaces are opposed to one another and operable to compress a quantity of the material therebetween. The stop is positioned at least partially between the pressing surfaces and has a thickness substantially equal to the desired uniform thickness of the layer. The stop is positioned to establish a spacing between the flat pressing surfaces that is substantially equal to the thickness of the stop and thereby to the desired uniform thickness of the layer when the pressing elements engage the stop. As a result, engagement of the stop by the pressing surfaces during pressing of the material forms a layer of the material of substantially uniform thickness with substantially parallel major surfaces formed by the flat pressing surfaces. The layer is then used in semiconductor processing to provide a flat surface on a layer of a substrate assembly, thereby enhancing the planarization of the substrate assembly.

16 Claims, 5 Drawing Sheets

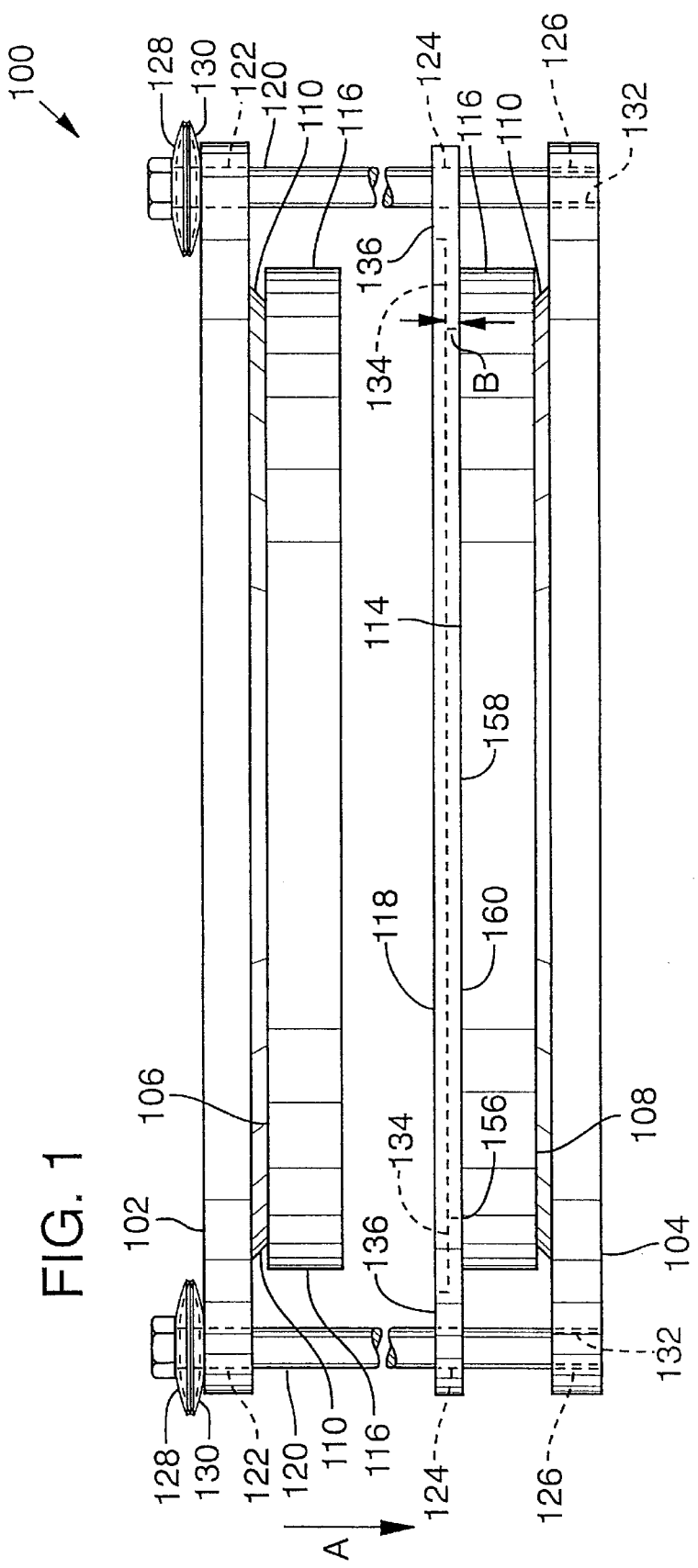

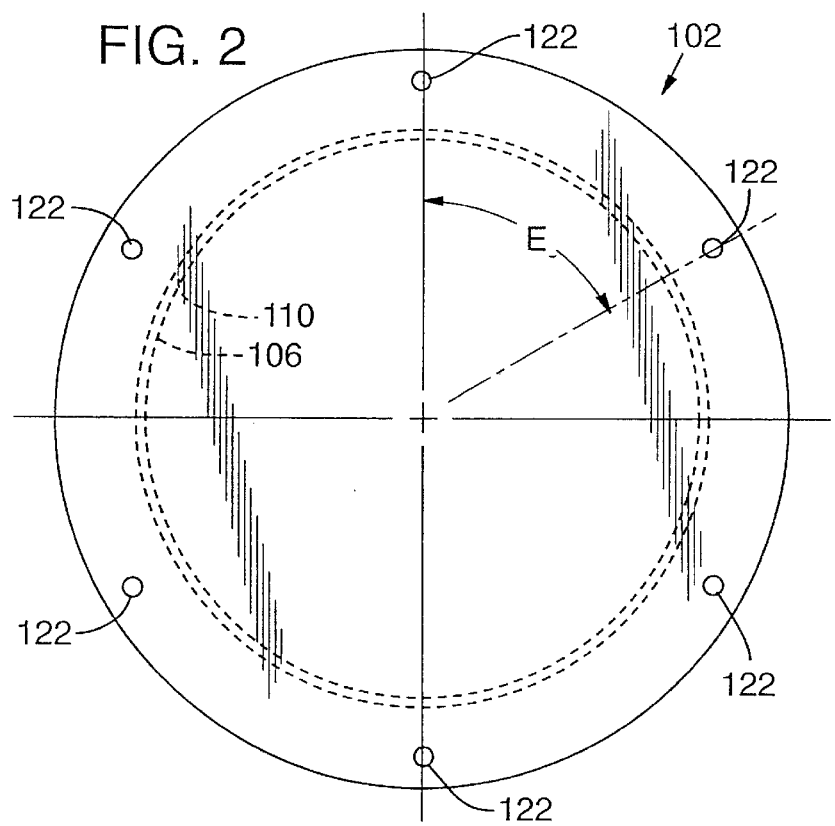
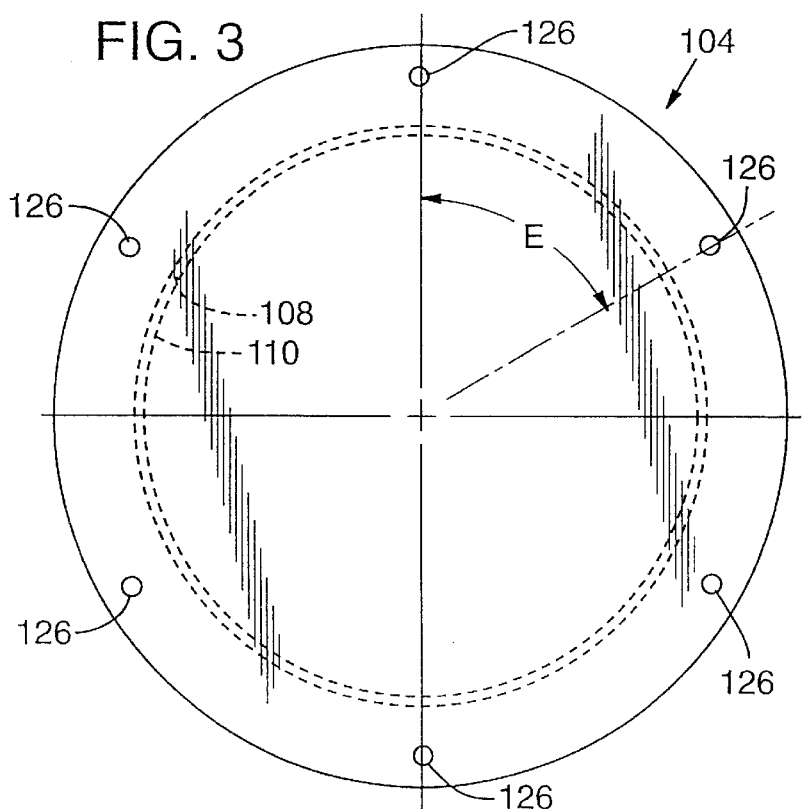

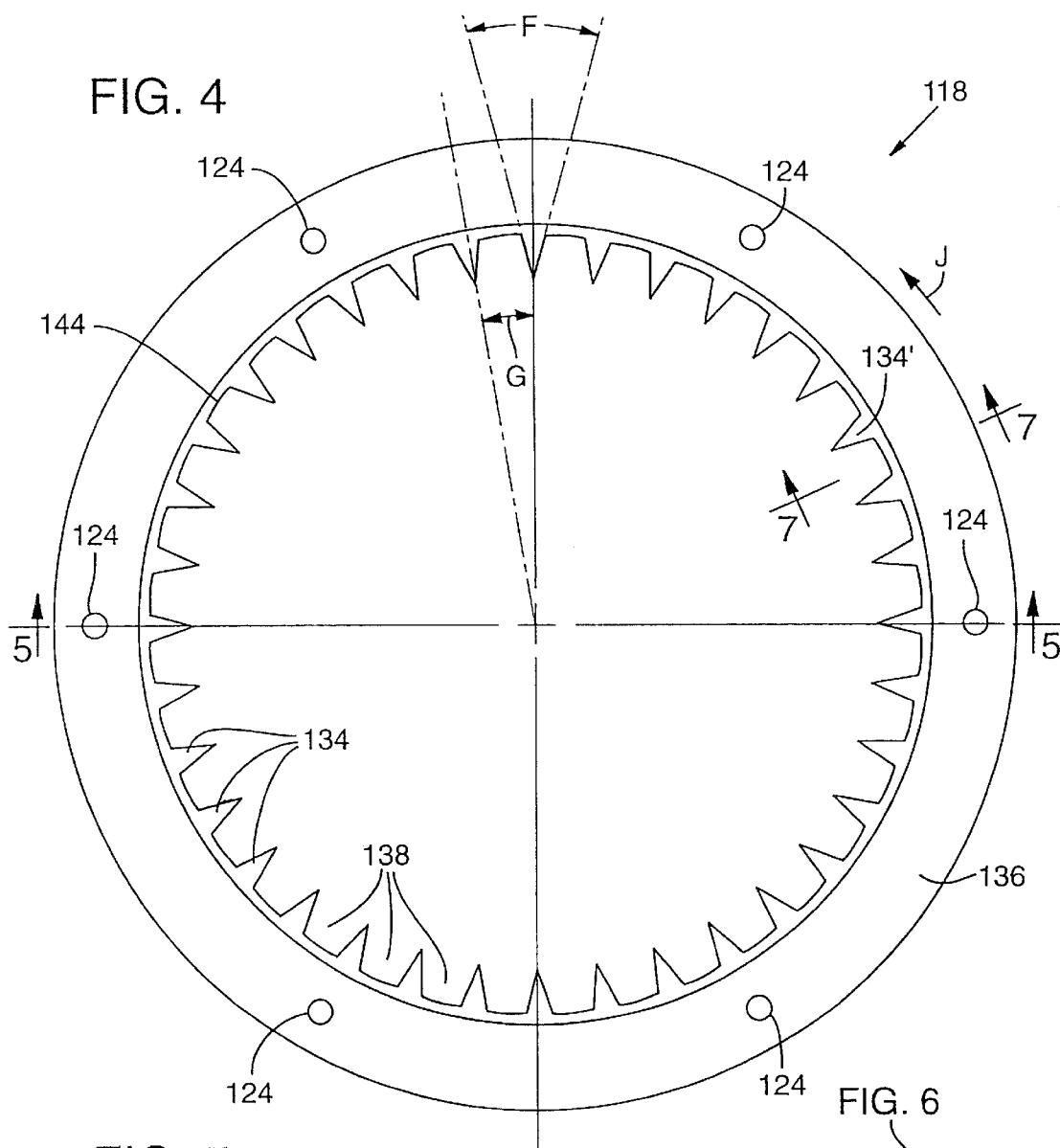
FIG. 4
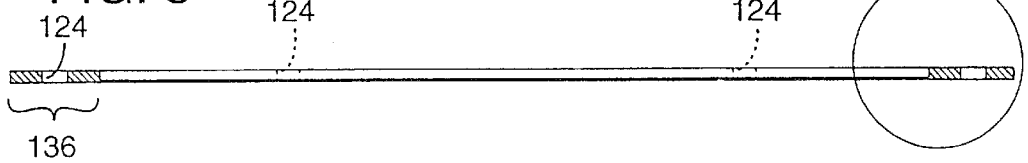
FIG. 5
FIG. 6

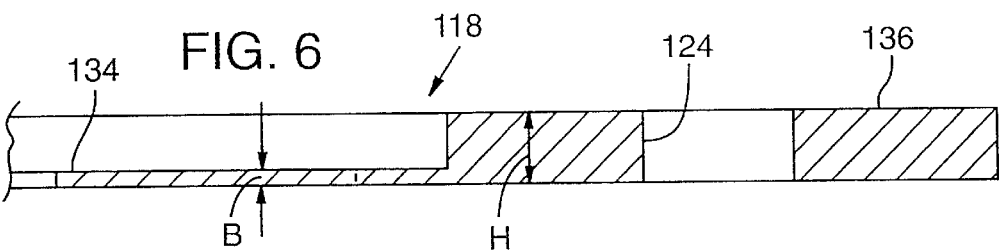
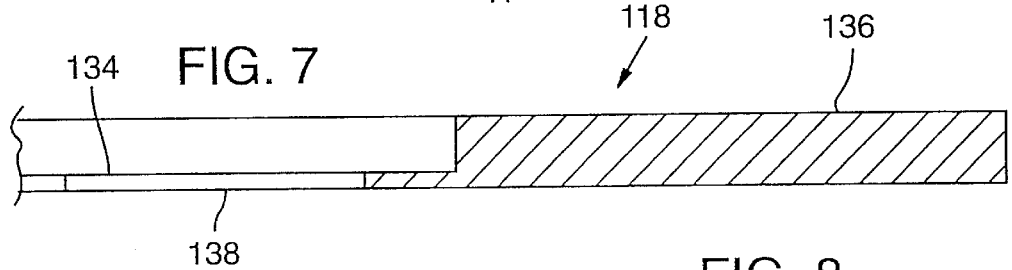
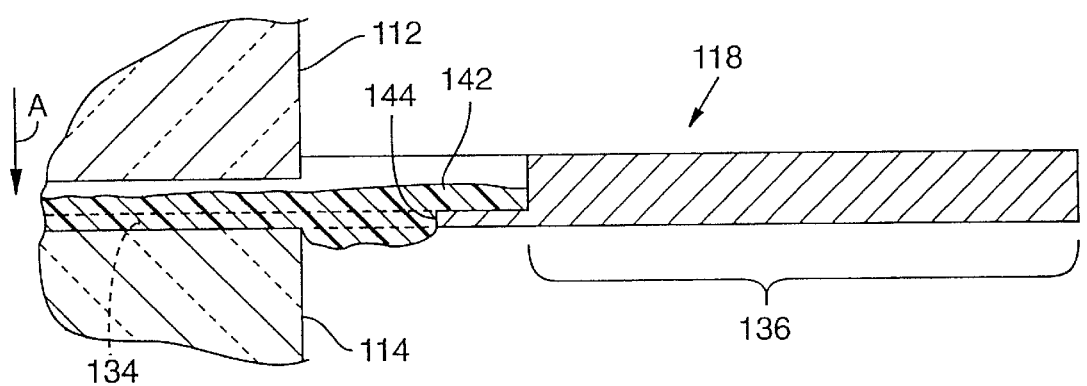
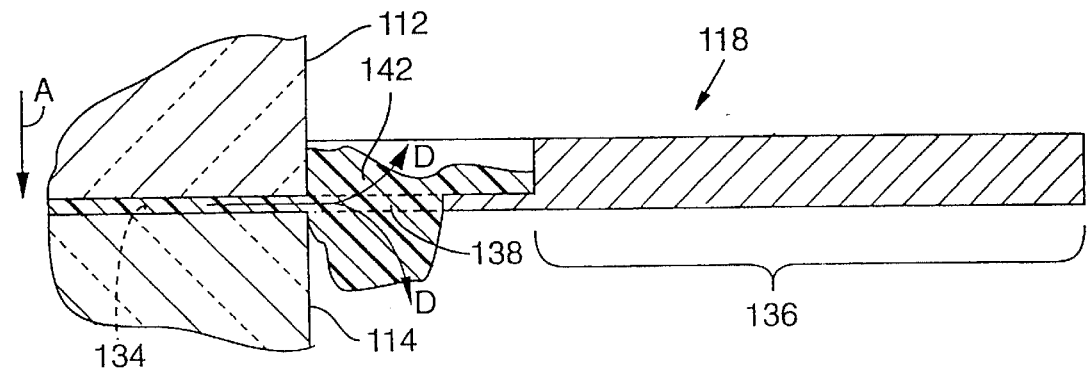

WAFER PLANARIZATION USING A UNIFORM LAYER OF MATERIAL AND METHOD AND APPARATUS FOR FORMING UNIFORM LAYER OF MATERIAL USED IN SEMICONDUCTOR PROCESSING

PRIORITY CLAIM

This application is a divisional of pending U.S. patent application Ser. No. 09/389,644, filed Sep. 2, 1999.

BACKGROUND OF THE INVENTION

This invention relates to methods and apparatus for forming a uniform layer of material for use in connection with manufacturing a substrate assembly during semiconductor processing, and also the layer itself. The invention also relates to a method of planarizing a semiconductor wafer.

As used herein, "substrate" refers to the lowest layer of semiconductor material in a semiconductor wafer, and "substrate assembly" refers to a substrate having at least one additional layer with structures formed thereon.

"Semiconductor flat" refers to a surface of the substrate assembly having a precision flat surface within desired tolerances. A significant aspect of semiconductor processing is planarization, i.e., ensuring that the semiconductor flat and other layers are planar within a predetermined specification.

Production methods for semiconductors are known. A particular class of methods involves: etching or otherwise forming desired channels or trenches in a substrate assembly surface, applying a dielectric epoxy layer which fills the trenches over the substrate assembly surface, using an apparatus to press the substrate assembly having the epoxy layer to achieve desired surface characteristics (e.g., flatness) on the epoxy layer, and then removing the pressed substrate assembly from the apparatus for further processing. The epoxy may be of a type which is cured with ultraviolet radiation.

Removing the pressed substrate assembly from the apparatus is difficult, however, because the epoxy begins bonding with the pressing surface. Therefore, according to some methods, the epoxy layer is first covered with a layer of a cover material before the pressing takes place. The cover material is selected to allow easy removal/release of the pressed substrate from the apparatus.

In addition, the cover or release member must be transparent to the ultraviolet radiation if an epoxy of the type cured by ultraviolet radiation is used to cure the epoxy layer beneath the cover material. It has been previously determined that fluorinated ethylene-propylene (FEP) can be used as the cover material. Some types of FEP are transparent to ultraviolet radiation, and thus do not affect the epoxy curing by ultraviolet radiation passing through the cover.

The cover material is placed over the epoxy layer before the substrate assembly is pressed, and thus the cover material surface characteristics are transferred to the substrate assembly surface. If the cover material is a uniform layer, which is defined as a layer having parallel major (top and bottom) surfaces that are planar, within predetermined tolerances, the pressing action applied through the cover material will be uniformly transferred to the epoxy layer as desired. As one result, if the cover material is a uniform layer, the substrate assembly surface can be formed to the same flatness as the pressing surface.

In practice, achieving a sufficiently uniform layer of a cover material such as of FEP has not been achieved utilizing known techniques. Because of the nature of FEP material and the desired thickness of a typical cover (about 0.020 in. thick), the dimensions of a FEP cover are difficult to control. For example, in one approach where ultraviolet transmissive FEP has been heated to a temperature below its melting point and pressed between two optical flats during pressing, the major surfaces of the resulting FEP layer end up significantly skewed or out of parallel from one another. As used herein, optical flats are defined as precision pressing surfaces, e.g., surfaces that are flat to within one quarter of a wavelength of light.

The temperature range for processing the FEP is very narrow. An acceptable temperature is slightly below the melting glass flow transition point, which allows the FEP material to acquire the surface smoothness characteristics of the optical flats. Since high pressures are required to make the FEP surface conform to the optical flats surfaces, at temperatures below the glass transition point (i.e., in the plastic state), maintaining the material at a consistent thickness is very difficult. This difficulty is due to the uncontrolled movement of FEP material from the higher pressure zones to the lower pressure zones at the perimeter of the pressing mechanism. Consequently, the thickness of the layer is no longer satisfactorily uniform.

When used as a cover layer, this non-uniformity in thickness caused variations in the thickness of the epoxy layer. Consequently, during subsequent semiconductor wafer processing, involving etching through the epoxy layer, undesirable non-uniform etching would occur because thinner portions of the epoxy layer would be etched through first. For example, FEP sheets exhibiting these problems had major surfaces which were flat to within about 30–35 angstroms, but which were only parallel to one another within ±0.010 in., have been obtained using known processes.

Accordingly, it would be desirable to provide a method and apparatus by which FEP and other materials used as cover layers on a substrate assembly could be produced within desired uniform layer specifications.

SUMMARY

Wafer planarization is enhanced utilizing a layer of material having a substantially uniform thickness and substantially parallel first and second major surfaces. The layer is used in producing a flat on or planarizing a substrate assembly.

In one embodiment, an apparatus having a substantially uniform thickness and substantially parallel first and second major surfaces includes a pair of pressing elements and a stop. The layer of material formed by the apparatus used in producing a flat on semiconductors. Each of the pair of pressing elements has a flat pressing surface. The pressing surfaces are opposed to one another and operable to compress a quantity of the material therebetween. The stop is positioned at least partially between the pressing surfaces and has a thickness substantially equal to the desired uniform thickness of the layer. The stop is positioned to establish a spacing between the flat pressing surfaces that is substantially equal to the thickness of the stop and thereby to the desired uniform thickness of the layer when the pressing elements engage the stop. As a result, engagement of the stop by the pressing surfaces during pressing of the material forms a layer of the material of substantially uniform thickness with substantially parallel major surfaces formed by the flat pressing surfaces.

The apparatus can also include a heater that heats the material to a temperature where it flows without melting.

Further, the apparatus can include a compression force applicator to move one or both of the pressing surfaces. The compression force applicator can include a plurality of biasing elements.

The pressing surfaces can be optical flats. The shim can have a plurality of projections extending inwardly from the border portion with overflow material recesses positioned between the projections. The projections can be of a triangular shape.

In a specific example, the first and second major surfaces of the layer are each within 100 angstroms of being flat. Preferably, in this example, the first and major second surfaces of the layer are at least within 0.000005 in. of being parallel to one another. In this example, a stop portion of the shim is about 0.020 in. thick. The cover layer may also be transparent to ultraviolet radiation.

According to an exemplary method, a layer is formed by heating material and pressing the material between first and second flat pressing surfaces. A stop is disposed between the first and second pressing surfaces to limit the extent to which the first and second pressing surfaces approach one another during pressing to thereby form a layer of substantially uniform thickness having first and second major surfaces with the first and major second surfaces being formed by the flat pressing surfaces. Thereafter, one of the first and major second surfaces of the formed layer may be applied to a flat surface of a substrate assembly. In this approach, the heating step may include heating the material until the material transitions to a plastic state without melting.

The formed layer may be applied, for example, over an epoxy layer of a substrate assembly. The assembly may then be pressed by precision optical flats with the flatness of the optical flats being transferred to the epoxy layer through the formed layer. The formed layer in this case prevents the epoxy layer from adhering to the pressing apparatus.

BRIEF DESCRIPTION OF THE DRAWINGS

FIG. 1 is a side view of an apparatus for achieving a uniform thickness of a material to be applied to a substrate.

FIG. 2 is a top view of an upper lid of the apparatus of FIG. 1.

FIG. 3 is a bottom view of a lower lid of the apparatus of FIG. 1.

FIG. 4 is a top view of the shim of the apparatus of FIG. 1.

FIG. 5 is a side sectional view of the shim of FIG. 4 along the line V—V.

FIG. 6 is a magnified view of an edge portion of the shim sectional view of FIG. 5 showing a tooth portion.

FIG. 7 is a side sectional view of the shim of FIG. 4 along the line VII—VII and corresponding to FIG. 6, but showing an open region.

FIG. 8 is a side sectional view of an edge portion of the apparatus showing the upper optical flat beginning to press against material applied on the lower optical flat with the shim between the upper and lower optical flats, while being heated in an oven.

FIG. 9 is a side sectional view of a portion of the apparatus of FIG. 8 showing the apparatus after pressing is complete with the upper and lower optical flats in contact with the shim and the material within the shim pressed to a uniform thickness.

DETAILED DESCRIPTION OF PREFERRED EMBODIMENTS

Figure 10:
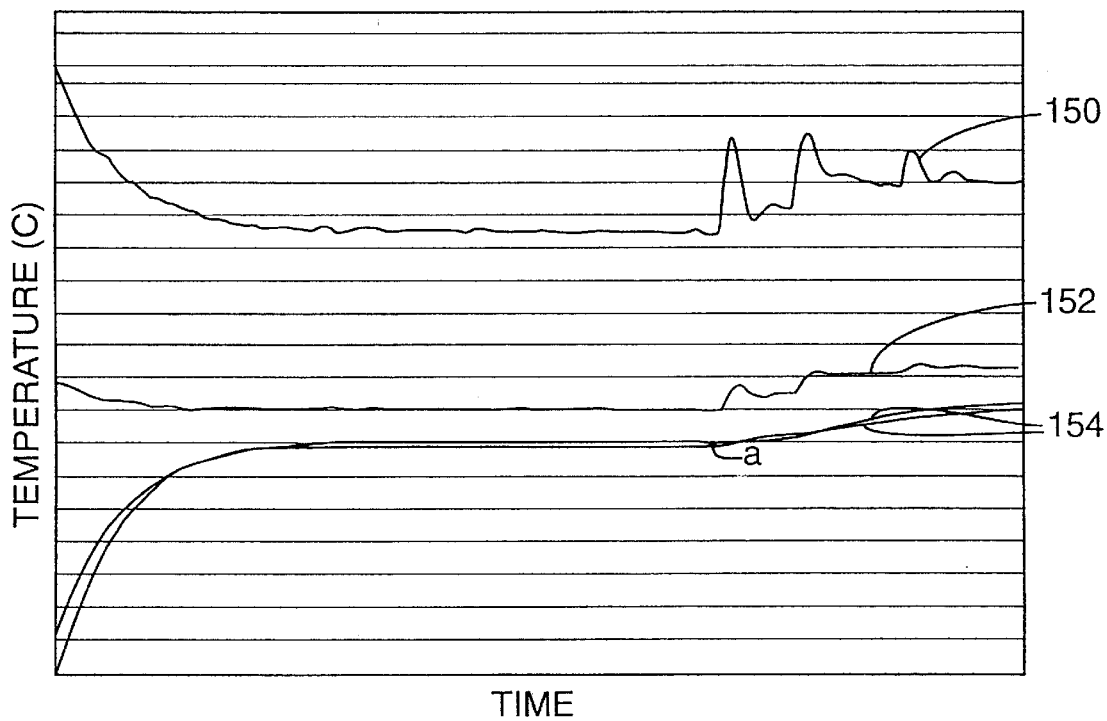
FIG. 10 is a graph of time-temperature profiles showing the temperatures of a heater element, an oven air temperature and a representative FEP material being pressed during a heating process.

FIG. 1 shows one form of a press assembly 100 for achieving a desired uniform layer of a material to be applied on a substrate assembly during manufacture. The uniform layer is used in producing a flat on a semiconductor. The assembly 100 includes an upper lid 102, a lower lid 104, an upper optical flat 112, a lower optical flat 114 and a stop which limits the extent to which 112, 114 approach one another and which may take the form of a shim 118. In the illustrated embodiment, these components each have a generally circular periphery, and are coaxially aligned with each other. For clarity, the upper lid 102 and upper optical flat 112 are shown spaced from the shim 118, lower optical flat 114 and lower lid 104.

During operation of the assembly 100, the upper optical flat 112 and the lower optical flat 114 serve as pressing elements that are pressed together under predetermined heating conditions against the shim 118, thereby pressing material applied on the lower optical flat 114 within the shim 118 to a uniform thickness. As shown in FIG. 1, a lower side of the shim 118 contacts an upper side or pressing surface of the lower optical flat 114. A lower side of the lower optical flat 114 contacts a supporting surface 108 of the lower lid 104.

The shim 118 may be annular or ring-shaped with projections that extend inwardly and space the flats apart to a desired uniform distance when engaged by the flats. The projections may comprise a plurality of spaced apart fingers. In the specific form shown, the fingers comprise tooth points 134 that project inwardly at regularly spaced intervals (FIG. 4) from a border 136. Alternatively, the shim 118 may take other forms such as being shaped as an ellipse, triangle, square, rectangle or other closed geometrical shape. The tooth points 134 do not span the entire interior of the shim 118 and thus define an open center area or void 144. Communicating with the open center area 144 are overflow material receiving recesses, pockets or open regions 138 that lie between adjacent tooth points 134. Material in the open center area 144 is pressed to a desired thickness B, which is equal to the thickness of the tooth points, when the upper optical flat 112 and the lower optical flat 114 are pressed together in a press direction A against the tooth points 134.

As described below, excess material is pressed outward from between the upper optical flat 112 and the lower optical flat 114 through the open regions 138. The excess material flows outward from the open center area 144 through the open regions 138 into areas adjacent the periphery of the first optical flat 112 and the second optical flat 114.

The pressing action in the press direction A is achieved through a compression force or pressure applicator. In an illustrated embodiment, the pressing action is achieved using elongated fasteners or bolts 120 that slidably extend through apertures 122 in the upper lid 102 and apertures 124 in the shim 118, and are threaded into apertures 126 in the lower lid 104. Threaded ends of the bolts 120 are received in helicoils 132 positioned within the apertures 126. The bolts 120 are each inserted through one or more biasing elements. In the form shown, the bolts 120 are each inserted through a pair of Belleville washers 128, 130 oriented in a stacked back-to-back orientation to create a pressing action when the bolts 120 are tightened. The illustrated assembly 100 is preferably secured together by six such bolts 120 at equally spaced intervals, but for clarity, only two bolts 120 are shown in FIG. 1. Prior to pressing, the upper optical flat 112 may be separated from the shim 118 by, for example, approximately 3/16 in.

The upper optical flat 112 and the lower optical flat 114 are cylindrically shaped and each have at least one precision pressing surface. The pressing surfaces are preferably flat to at least to within 100 angstroms and more preferably flat to at least within 50 angstroms. In a specific example, these optical flats are half-wavelength flats having a flatness of 30–35 angstroms. The optical flats may be made of a quartz material. Although the size of the flats may vary in a specific example, they have a diameter of approximately 9 in. and a thickness of approximately 1 ½ in. Thus, the upper lid 102, the lower lid 104, the shim 118 and the bolts 120 are sized accordingly.

To prevent damage to the quartz material, the upper lid 102 and the lower lid 104 may have an upper supporting surface 106 and a lower supporting surface 108, respectively, with beveled ends 110. The edges 116 of the upper optical flat 112 and the lower optical flat 114 are spaced outward of the beveled ends 110. As a result, the edges 116 of the upper optical flat 112 and lower optical flat 114 are not directly loaded during pressing.

The upper lid 102 and the lower lid 104 may be made of a heat conducting material such as aluminum. The shim 118 may be, for example, made of stainless steel. The Belleville washers 128, 130 may also be made of stainless steel and rated at, for example, 150 lbs.

FIG. 2 is a top view of the upper lid 102 showing its upper surface. FIG. 2 shows the six equally spaced apertures 122 separated from each other by an angle E (i.e., 60°). FIG. 2 also shows the relative positions of the upper optical surface 106 and the bevel 110 on the lower surface of the upper lid 102.

FIG. 3 is a bottom view of the lower lid 104 showing its lower surface. Similar to the upper lid 102, FIG. 3 shows the six equally spaced apertures 126 separated from each other by the angle E, as well as the uniform lower support surface 108 and the bevel 110 on the upper surface of the lower lid 104. The apertures 126 of the lower lid 104 are fitted with helicoils 132 (not shown), as described above, for receiving threaded ends of the bolts 120.

FIG. 4 is a top view of the illustrated shim 118 showing its upper surface with the border portion 136 from which the inwardly projecting tooth points 134 extend. The six equally spaced apertures 124 shown in this example extend through the border portion or reinforcing section 136. Each tooth point 134 defines an acute included angle F. Although variable, in the form shown, the angle F is 30°. Apexes of adjacent tooth points 134 are separated from each other by an acute tooth point spacing angle G. In the illustrated embodiment, the angle G, although it may be varied, is 10°, and thus there are 36 tooth points 134 total. There are also 36 open regions 138 interspersed between adjacent pairs of the tooth points 134. The major surfaces (i.e., the top and the bottom) of the teeth 134 are formed to be parallel with each other within a desired tolerance. In a specific example, this is +0/−0.000005 in.

The open central area of the shim, between the apexes of a pair of diametrically opposed tooth points 134, is sized large enough to result in a uniform sheet of the desired size. For example, a circular central area having a diameter of 8.12 inches, between the apex of a tooth and the apex of a diametrically opposed tooth, may be used to produce a circular sheet of material having the desired uniform thickness and flatness, which is at least eight inches in diameter. The use of pointed teeth for the projections facilitates the flow of material past the projections and minimizes the possibility of non-uniformities in the sheet extending inwardly into the central area from the teeth. Alternatively, the sheet may be made significantly oversized, in which case non-uniformities at the edge of the sheet may be trimmed while still having a sheet of the desired size with the desired uniformity.

FIG. 5 is a side sectional view of the shim 118 along the line V—V of FIG. 4. FIG. 6 is a magnified view of a right side portion of the sectional view in region VI of the shim 118 of FIG. 5. FIG. 6 shows the extent by which the tooth points 134 extend inwardly from the border portion 136. As also shown in FIG. 6, the border portion 136 has a thickness H that is substantially greater than the thickness B of the tooth points 134 extending inwardly from the border portion 136.

FIG. 7 is a sectional view of the shim 118 along the line VII—VII of FIG. 4 on a scale comparable to FIG. 6. FIG. 7 shows the extent of the open regions 138 between adjacent tooth points 134, as well as the adjacent tooth point 134' in the counterclockwise direction.

FIG. 8 is a partial side view of a right end of the upper optical flat 112, the lower optical flat 114 and the shim 118. The portion of the shim 118 shown in FIG. 8 is the same as in FIG. 7, i.e., showing one of the open regions 138 and the adjacent tooth point 134'. In FIG. 8, a layer 142 of cover material has been deposited on the lower optical flat 114 and over the tooth points 134 of the shim 118, and the upper optical flat 112 and the lower optical flat 114 are being pressed together in the direction A, while being heated in an oven 300. As shown in FIG. 8, the layer 142 has an initial thickness C that is about two times thicker than the desired layer thickness B.

FIG. 9 is a view similar to FIG. 8, but showing the configuration after the upper optical flat 112 and the lower optical flat 114 have been pressed together until stopped by the shim 118. As shown in FIG. 9, the layer 142 has been pressed to the thickness B uniformly, and excess material has been forced out from between the upper optical flat 112 and the lower optical flat 114 along the path D through the open regions 138.

Assume the layer 142 is to be of FEP, and the desired thickness B of the layer 142 is 0.020 in. To manufacture such a layer, one specific approach is as follows:

(1) the layer 142 is initially deposited on the lower optical flat 114 within the open center area 144 of the shim 118 to a level about twice the desired thickness B (i.e., the starting thickness of the FEP may be about 0.040 in.);

(2) the assembly 100 is heated in an oven to cause the layer 142 to flow, but is maintained below the melting point of FEP;

(3) a spring force in the case applied by the Belleville washers 28, 30, press the upper optical flat 112 and the lower optical flat 114 together, in a controlled manner;

(4) excess FEP passes outward from between the upper optical flat 112 and the lower optical flat 114 and into the open regions 138;

(5) after the desired thickness B is reached, i.e., when the upper optical flat 112 bears against the shim 118, the assembly 100 is allowed to cool;

(6) the excess FEP is then removed;

(7) the bolts 120 are loosened and the upper optical flat 112 and the shim 118 are raised; and (8) the layer 142, which is a uniform layer having a thickness B, is removed from the lower optical flat 114.

Alternatively, only the pressing surfaces, the shim 118 and the layer 142 need to be heated to cause the layer 142 to flow.

The raw FEP is typically provided in sheets which are normally 0.04 in. thick. These sheets are typically formed using rollers and have significant thickness variations. Also, defects may exist in these sheets, such as bubbles. Typically, the raw material sheets are visually screened, and portions having bubbles or other significant defects that are likely to show up in the finished layer are discarded. However, minor bubbles or defects in the raw material near the expected edges of the finished layer may be allowed to remain as they disappear during pressing and flowing process of making the finished layer.

FIG. 10 is one example of a time-temperature profile of various temperatures in a pressing process in which FEP is used as the layer 142. The curve 150 shows the temperature of a heating element within the oven. The curve 152 shows the air temperature within the oven. The two curves 154 represent the temperature of the FEP as measured by thermocouples 156, 158 and 160 at the periphery, center, and halfway between the periphery and the center, respectively, of the lower optical flat 114 (FIG. 1).

The melting point of the specific FEP of this example is 270 C. It is desirable to heat the FEP until it transitions to a plastic state and begins to flow, but does not melt. At point a, following a soak of approximately 12 hours, the temperature of the layer 142 is stabilized at about 223 C. An extended soak period is used to prevent the possibility of overheating the layer 142 beyond the melting point. It is also desirable to heat the upper optical flat 112 and the lower optical flat 114 evenly, i.e., until the temperatures of the peripheries and the centers of the optical flats are within ½ to 1 C of each other.

After point a, the temperature of the oven is raised, as shown in the curves 150 and 152, to increase the temperature of the layer 142 slightly. Thereafter, the layer 142 reaches the temperature at which the FEP flows, and the pressing takes place until stopped by the shim 118.

In another example using PTFE as the layer 142, a time-temperature profile similar to FIG. 10 may be used. The melting point of one specific PTFE is approximately 317 C, and the soak temperature is approximately 270 C. Besides these differences, the process is generally similar to the process described above for the layer 142 made of FEP. Of course, other temperature heating profiles may also be used.

With the pressing complete, excess material is trimmed from the assembly 100 near the peripheries of the upper optical flat 112 and the lower optical flat 114 such as with a dull knife.

The pressed uniform layer 142 is then allowed to cool, for example, slowly to avoid thermal shock. In one process, the pressed layer 142 is allowed to cool for approximately 6 hours. Over the course of the cool down period, the layer 142 may shrink by 0.050 to 0.100 in diameter. After the cool down period is concluded, the pressure is released, and the layer 142 is complete. The cover layer may be removed and used in subsequent semiconductor processing.

Figure 11:
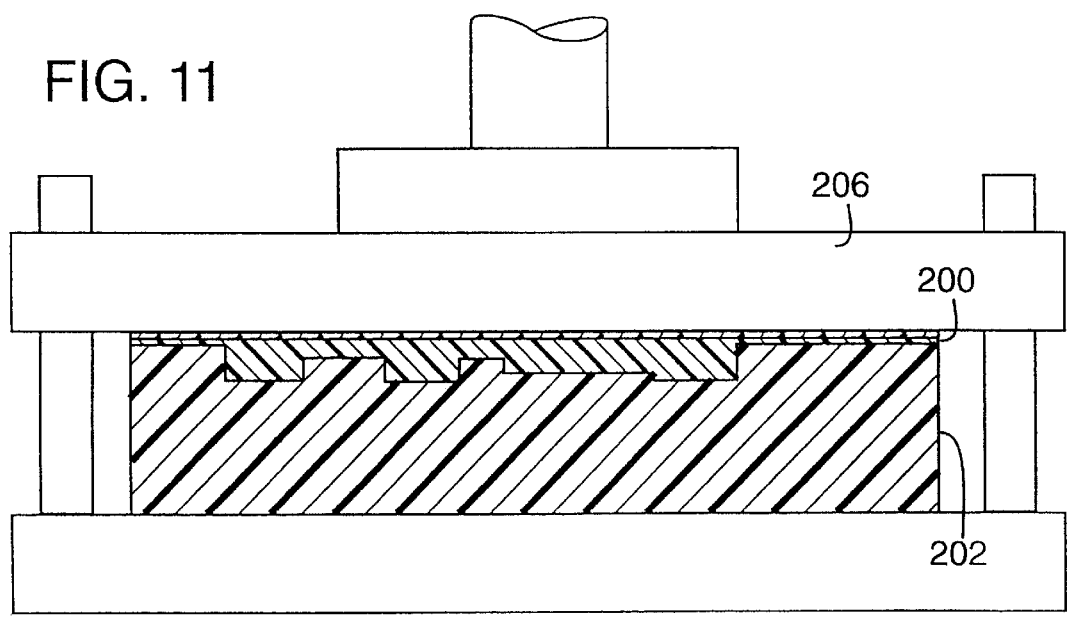
FIG. 11 is a schematic side view of a substrate assembly with a cover layer applied over an epoxy layer.

FIG. 11 is a schematic side view of a substrate assembly with a cover layer. As shown in FIG. 11, the uniform layer 142 that has been pressed to uniform thickness has been applied over an epoxy layer 200 of a substrate assembly 202 before the substrate assembly 202 is subsequently pressed and cured with ultraviolet radiation. A pressing apparatus is shown schematically, in a state separated from the substrate assembly 202, at 206. The epoxy layer 200 has been applied to fill trenches 204 in the substrate assembly 202.

With the layer 142 in place between the pressing apparatus 206 and the epoxy layer 200, the completed substrate assembly 202 is easily removed from the pressing/curing assembly (if necessary, air can be directed between the layer 142 and the pressing surface of the pressing apparatus 206 to facilitate removal). Because the layer 142 is uniform (the major surfaces are substantially flat and parallel), the precision of the pressing surface of the pressing apparatus 206 is transferred to the epoxy layer 200 of the substrate 202. One suitable epoxy is DEN431 Novalak resin mixed with a solvent to achieve a desired consistency.

Although FEP is a preferred cover material for use as the layer 142, other plastic materials that can be heated to a plastic state without melting can also be used, with consideration of the other requirements discussed above. One specific FEP is available from McMaster-Carr of Los Angeles, Calif. under the catalog designation 85375K114.

In the methods and apparatus described above, one of the pressing surfaces remains stationary, whereas the other of the pressing surfaces is moved. Optionally, both pressing surfaces may be moved toward each other, as would be known to those with ordinary skill in the art.

Having illustrated and described the principles of our invention with reference to several preferred embodiments, it should be apparent to those of ordinary skill in the art that the invention may be modified in arrangement and detail without departing from such principles. We claim as our invention all such modifications that fall within the scope of the following claims.

What is claimed is:

1. A method of forming a layer of material on a substrate assembly comprising:

introducing material for forming the layer into an open central region of a stop;

disposing the stop at least partially between first and second flat pressing surfaces;

pressing the material between the first and second flat pressing surfaces, wherein the stop is configured to limit the extent to which the first and second flat pressing surfaces approach one another during pressing to thereby form a layer of material having a substantially uniform thickness; and applying the layer of material to a surface of the substrate assembly.

2. The method of claim 1, further comprising pressing the layer of material against the surface of the substrate assembly with a pressing apparatus so as to planarize the surface of the substrate assembly.

3. The method of claim 2, further comprising removing the layer of material from the planarized surface of the substrate assembly.

4. The method of claim 1, wherein the method further comprises providing a substrate assembly having an epoxy layer, applying the layer of material to a surface of the epoxy layer, and pressing the layer of material against the epoxy layer to planarize the surface of the epoxy layer.

5. The method of claim 1, wherein the stop has a plurality of inwardly extending, spaced-apart projections circumscribing the open central region and material receiving recesses defined between adjacent projections, and wherein pressing the material between the first and second flat pressing surfaces causes excess material to flow into the material receiving recesses.

6. A method of forming a layer of material on a substrate assembly comprising:

soaking the material at a soaking temperature below a melting point of the material until a temperature throughout the material is substantially uniform;

pressing the material between first and second flat pressing surfaces;

positioning a stop between the first and second flat pressing surfaces to limit the extent to which the first and second flat pressing surfaces approach one another during pressing to thereby form a layer of material with first and second major surfaces being formed by the first and second flat pressing surfaces, respectively, the layer of material having a substantially uniform thickness; removing the layer of material from the first and second flat pressing surfaces; and placing the layer of material over a surface of the substrate assembly.

7. The method of claim 6, further comprising pressing the layer of material against the surface of the substrate assembly to planarize the surface of the substrate assembly.

8. The method of claim 6, further comprising pressing the layer of material against the surface of the substrate assembly with a pressing apparatus to planarize the surface of the substrate assembly such that the layer of material prevents the surface of the substrate assembly from adhering to the pressing apparatus.

9. The method of claim 7, wherein the thickness of the layer of material does not vary more than about five millionths of an inch.

10. A method of forming a layer of a material on a substrate assembly comprising:

providing first and second flat pressing surfaces for pressing the material;

positioning a shim between the first and second flat pressing surfaces;

pressing the material between the first and second flat pressing surfaces to form a layer of material, the shim being configured to limit the extent to which the first and second flat pressing surfaces approach one another during pressing so as to define the thickness of the layer of material, the layer of material having first and second major surfaces formed by the first and second flat pressing surfaces, respectively, and wherein the first and second major surfaces are within about fifty angstroms of being flat and the thickness of the layer of material does not vary more than about five millionths of an inch; and applying one of the first and second major surfaces to a surface of the substrate assembly.

11. The method of claim 10, wherein the layer of material is transparent to ultraviolet radiation.

12. The method of claim 10, wherein the shim has an open central region for receiving material for forming the layer of material and a plurality of inwardly extending, spaced-apart projections circumscribing the open central region with material receiving recesses defined between adjacent projections, and wherein pressing the material between the first and second flat pressing surfaces causes excess material to flow into the material receiving recesses.

13. A method of forming a layer of a material on a substrate assembly comprising:

heating the material until the material has a substantially uniform temperature that is below the melting point of the material;

pressing the material between first and second flat pressing surfaces to form a layer of material having first and second major surfaces formed by the first and second pressing surfaces, respectively, and wherein the first and second major surfaces are within about fifty angstroms of being flat and the layer of material has a thickness between the first and second major surfaces that does not vary greater than about five millionths of an inch;

disposing the layer of material at least partially between a surface of the substrate assembly and a third pressing surface; and planarizing the surface of the substrate assembly by pressing the layer of material against the surface of the substrate assembly with the third pressing surface.

14. A method of forming a layer of a material on a substrate assembly comprising:

heating the material;

pressing the material between first and second flat pressing surfaces;

disposing a stop between the first and second pressing surfaces to limit the extent to which the first and second pressing surfaces approach one another during pressing to thereby form a layer of substantially uniform thickness having first and second major surfaces with the first and second major surfaces being formed by the flat pressing surfaces; and applying one of the first and second major surfaces to a surface of a substrate assembly.

15. The method of claim 14 wherein the heating act comprises heating the material until the material transitions to a plastic state without melting the material.

16. The method of claim 14 wherein the substrate assembly has an epoxy layer and the applying act comprises applying one of the first and second major surfaces of the layer to a surface of the epoxy layer of the substrate assembly.

* * * * *